Aug. 6, 1968 R. W. HOEPPEL 3,396,345

STABLE TRANSISTOR AUDIO OSCILLATOR

Filed Oct. 24, 1966

Raymond W. Hoeppel INVENTOR.

United States Patent Office 3,396,345

Patented Aug. 6, 1968

3,396,345
STABLE TRANSISTOR AUDIO OSCILLATOR

Raymond W. Hoeppel, P.O. Box 5,
Oak View, Calif. 93022

Filed Oct. 24, 1966, Ser. No. 588,987
7 Claims. (Cl. 331—117)

ABSTRACT OF THE DISCLOSURE

A stable transistorized Hartley oscillator is attained by the addition of a diode and a resistor in the emitter circuit of the transistor, thus enabling the production of an audio signal that remains constant in frequency as the supply voltage is reduced from the normal operating voltage to zero. Such type of operation is desirable in the production of sustained tones by the capacitor discharge method, such as in electronic organs.

This invention relates to stable audio oscillators and more particularly to a transistorized Hartley type oscillator which is stable in frequency over a large range of applied operating voltage.

In electronic organs where sustained tones are to be produced, it is customary to charge a capacitor when keying an oscillator and then, when the key is released, the oscillator continues to operate until the capacitor is discharged, the volume gradually decreasing as the voltage decreases. This results in a bell-like tone, when the output is a sine wave, which gradually fades away. When the output is a complex wave, interesting sustained harpsichord or banjo tones are produced. The rate of decay of the sound will depend upon the size of the capacitor and the current consumption of the oscillator.

Most oscillators used in electronic organs today cannot be used to produce sustain tones in the above manner inasmuch as their frequency becomes erratic as the voltage drops to low values, with a resultant growl or whine when near the end of the period of sustained tone.

It is consequently an object of this invention to provide an audio frequency oscillator which will produce a constant frequency over a wide range of applied voltages and which may be coupled to a keyed capacitor charging and discharging circuit to produce sustained bell-like tones of great clarity and uniformity.

This is accomplished by utilizing a standard transistorized Hartley type oscillator with provision for inserting a current limiting device in the emitter circuit of the transistor, the limiting device comprising a combination of a diode and a resistor connected in electrical series. Such an oscillator must operate under a constant bias voltage, and the bias must be adjusted to the proper value to accomplish the desired results.

Figure 1:
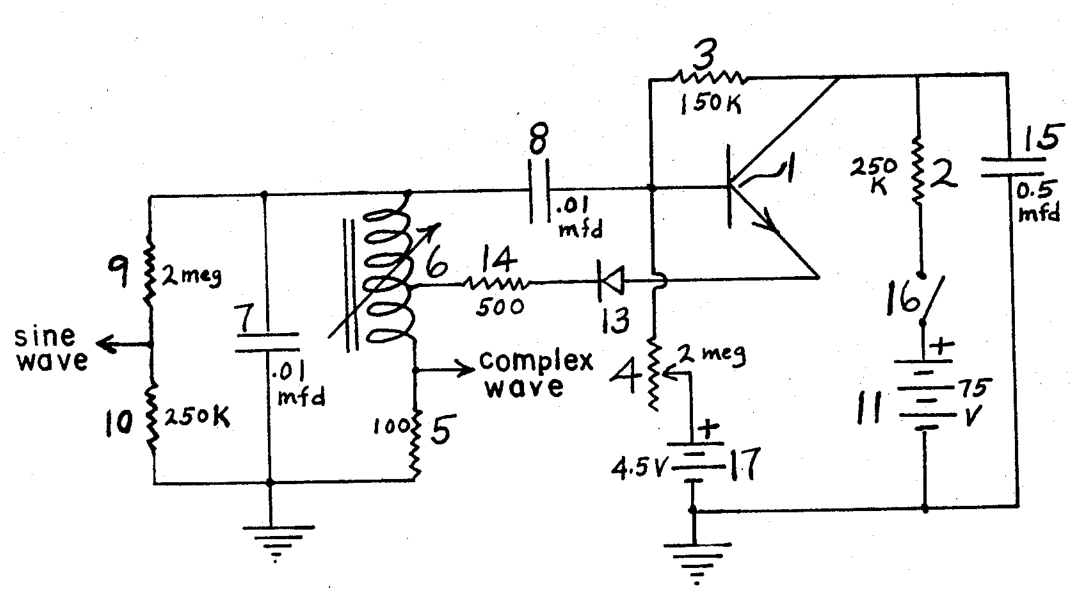
FIGURE 1 shows a schematic circuit of a Hartley oscillator incorporating the improvements disclosed in this invention.

In FIGURE 1 is shown a schematic circuit of one type of Hartley oscillator, designed to produce two different types of wave forms, this oscillator being stabilized by the insertion of a diode and resistor in the emitter circuit as taught by this invention. Without the resistor and diode this oscillator becomes unstable as the input voltage is reduced, especially when oscillating in the range of the higher frequencies. The values of the components are shown as typical to produce one of the higher notes of the keyboard. For other notes, changes can be made in the values of capacitors 7 and 8 and inductor 6.

In this circuit, current from power supply 11 is switched by key 16, while resistor 2 and capacitor 15 serve to suppress key clicks. The bias on the base of the transistor 1, is determined by resistors 3 and 4 and by the voltages of power supplies 11 and 17. In FIGURE 1, this bias is regulated by variable resistor 4, but it can also be regulated by varying resistor 3 or by varying the voltage of power source 17. If desired, this latter power source 17 may be dispensed with, regulating the bias by varying resistor 3 or resistor 4. If, when assembling the oscillator, resistors 3 and 4 are carefully selected to produce the proper bias needed to stabilize the oscillator, there is no need that either of these resistors be adjustable.

The signal from the emitter is passed through diode 13 and resistor 14 through a portion of inductor 6 and then through resistor 5 to ground, while the feedback signal comes from the upper portion of the inductor through blocking capacitor 8 to the base of the transistor as in a conventional Hartley circuit. Capacitor 7 serves to tune the oscillating circuit, with additional fine tuning permitted by varying the inductance of inductor 6 by altering an air gap in the iron core.

A complex waveform is derived from the upper side of resistor 5, and a sine wave is derived from the top of the inductor and is passed through isolating resistor 9 through load resistor 10, to produce a sinusoidal signal at the junction of resistors 9 and 10.

The greatest difficulty in attaining oscillator stabilization occurs in the higher frequency notes. Here careful adjustment of the bias on each note is generally required to attain stability. Usually the bias from one note to another will not vary more than a small fraction of a volt, however.

The resistor in the emitter circuit should not be too large if sounds rich in harmonics are desired. Normally it is of such value that the voltage drop across it is less than 20 percent of the voltage at the collector.

In the circuit shown, the resistor and diode are shown in the emitter circuit adjacent to the emitter. The resistor also may be placed in the ground side of the emitter circuit where it has less tendency to attenuate harmonics. The diode also may be placed in the ground side of the emitter circuit, with however some sacrifice in stability with some oscillators. It is preferred that the diode be inserted in the circuit between the emitter and the inductor, and it should be connected so that the emitter current flows readily in its forward direction.

The essential elements of the stabilized oscillator are the transistor, a source of power, an inductor, a tuning capacitor, the diode and resistor in the emitter circuit and a means to maintain a constant bias on the base of the transistor. Thus the circuit in essence comprises a conventional transistorized Hartley oscillator with the novel addition of a diode and resistor in the emitter circuit.

Figure 2:
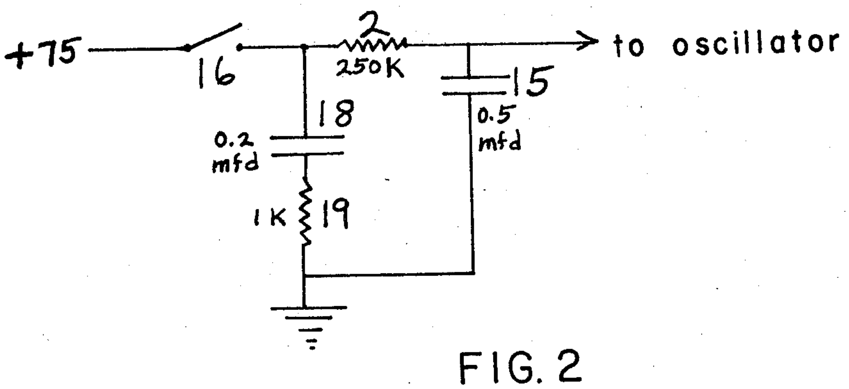
FIGURE 2 shows a keying circuit to be used with the oscillator of FIGURE 1 to produce sustained tones.

The stabilized oscillator of this invention may be operated to produce sustained unwavering bell tones by connecting it to an input circuit as shown in FIGURE 2. Here, key switch 16, when closed, starts the oscillator and simultaneously charges capacitor 18, the charging current being restricted by resistor 19. Upon release of the key switch the charge on the capacitor is gradually dissipated through the oscillator, and the output signal from the oscillator gradually diminishes in voltage.

What is claimed is:

1. A stable Hartley audio oscillator comprising in combination: an oscillator circuit having a transistor as a part thereof; tuned means coupling the output and input circuits of said transistor, said tuned means comprising capacitive means and an inductor having a ferromagnetic core; means to provide a constant bias voltage at the base of said transistor; and current restrictive means in the emitter circuit of said transistor to limit emitter current to unidirectional flow, said restrictive means comprising diode and resistor means connected in electrical series, said diode means being connected in circuit so that all of emitter current flows through said diode means.

2. A stable oscillator according to claim 1 including manually adjustable means to vary said bias.

3. A stable oscillator according to claim 2 wherein said adjustable means comprises a variable resistor.

4. A stable oscillator according to claim 1 including means to vary the inductance of said inductor.

5. A stable oscillator according to claim 1 wherein said current restrictive means is inserted in the emitter circuit adjacent to the emitter.

6. A stabilized oscillator according to claim 1 including an input circuit comprising a key switch and a capacitor, the capacitor charging when the key switch is closed and discharging gradually into the oscillator when the key switch is opened to thus produce a resultant sustained signal.

7. A stable oscillator according to claim 1 wherein said diode is inserted in the emitter circuit on the ground side of said inductor.

References Cited

UNITED STATES PATENTS

| | | | |
|---|---|---|---|
| 2,849,611 | 8/1958 | Adams | 331—117 |
| 2,906,959 | 9/1959 | Peterson | 331—117 X |

ROY LAKE, *Primary Examiner.*

S. H. GRIMM, *Assistant Examiner.*